United States Patent
Anderl et al.

(10) Patent No.: US 7,551,444 B2
(45) Date of Patent: Jun. 23, 2009

(54) METHOD AND COMPUTER SYSTEM WITH ANTI-TAMPER CAPABILITY AND THERMAL PACKAGING STRUCTURE FOR IMPLEMENTING ENHANCED HEAT REMOVAL FROM PROCESSOR CIRCUITRY

(75) Inventors: William James Anderl, Rochester, MN (US); Vincenzo Valentino Di Luoffo, Sandy Hook, CT (US); Eric Alan Eckberg, Rochester, MN (US); David Roy Motschman, Rochester, MN (US); Tamas Visegrady, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 11/930,539

(22) Filed: Oct. 31, 2007

(65) Prior Publication Data

US 2009/0109611 A1    Apr. 30, 2009

(51) Int. Cl.
*H05K 7/20* (2006.01)
(52) U.S. Cl. .............. 361/700; 361/704; 361/709; 257/715; 174/15.2; 165/80.4; 165/104.26
(58) Field of Classification Search ........... 361/700, 361/704, 709, 719; 257/714, 715; 174/15.2; 165/80.4, 104.26
See application file for complete search history.

(56) References Cited

U.S. PATENT DOCUMENTS

| | | | | |
|---|---|---|---|---|
| 5,880,524 A * | 3/1999 | Xie | ........................ | 257/704 |
| 6,525,420 B2 * | 2/2003 | Zuo et al. | .................. | 257/715 |
| 7,019,971 B2 * | 3/2006 | Houle et al. | ............... | 361/699 |
| 7,064,955 B2 * | 6/2006 | Harris et al. | ............... | 361/695 |
| 7,347,354 B2 * | 3/2008 | Hurley et al. | ............... | 228/219 |

* cited by examiner

*Primary Examiner*—Boris L Chervinsky
(74) *Attorney, Agent, or Firm*—Joan Pennington

(57) ABSTRACT

A method and computer processor system with anti-tamper capability and thermal packaging structure for implementing enhanced heat removal from processor circuitry, such as, a high-performance cell processor complex, and a design structure on which the subject circuit resides are provided. The computer system includes predefined processor circuits including anti-tamper logic. A volume container substantially contains the predefined processor circuits including the anti-tamper logic. A heat spreader is provided with the predefined processor circuits within the volume container. An external heatsink structure is attached to an outside cover above the volume container. The heatsink structure includes a heatsink base and a plurality of parallel fins extending outwardly from the heatsink base. A heat pipe extending through a folded mesh is attached to the heat spreader within the volume container and is attached to the external heatsink base providing an effective heat removal path for the processor circuits.

20 Claims, 4 Drawing Sheets und States Patent US 7,551,444 B2

METHOD AND COMPUTER SYSTEM WITH ANTI-TAMPER CAPABILITY AND THERMAL PACKAGING STRUCTURE FOR IMPLEMENTING ENHANCED HEAT REMOVAL FROM PROCESSOR CIRCUITRY

FIELD OF THE INVENTION

The present invention relates generally to the data processing field, and more particularly, relates to a method and computer processor system with anti-tamper capability and thermal packaging structure for implementing enhanced heat removal from processor circuitry, such as, a high-performance cell processor complex, and a design structure on which the subject circuit resides.

DESCRIPTION OF THE RELATED ART

A need exists for an effective cooling and packaging arrangement for a computer processor system, such as, a Cell Processor and Card Complex, requiring anti-tamper capability.

One known solution today is to provide total physical encapsulation of the card electronics for a computer system requiring anti-tamper capability. The main drawback is that this known arrangement significantly limits the amount of heat that can be dissipated in the device, typically 10 watts.

A need exists for such an effective cooling and packaging arrangement for a computer processor system having anti-tamper capability, for example, enabling substantially increased power dissipation in the processor circuitry, such as an order of magnitude increase or at least 100 watts in power dissipation, while keeping the processor device temperatures below a required maximum specification.

SUMMARY OF THE INVENTION

Principal aspects of the present invention are to provide a method and computer processor system with anti-tamper capability and thermal packaging structure for implementing enhanced heat removal from processor circuitry, such as, a high-performance cell processor complex, and a design structure on which the subject circuit resides. Other important aspects of the present invention are to provide such method and computer processor system with anti-tamper capability substantially without negative effect and that overcome many of the disadvantages of prior art arrangements.

In brief, a method and computer processor system with anti-tamper capability and thermal packaging structure for implementing enhanced heat removal from processor circuitry, such as, a high-performance cell processor complex, and a design structure on which the subject circuit resides are provided. The computer system includes predefined processor circuits including anti-tamper logic. A volume container substantially contains the predefined processor circuits including the anti-tamper logic. A heat spreader is provided with predefined processor circuits within the volume container. A heatsink structure is attached to an external cover above the volume container. The heatsink structure includes a heatsink base and a plurality of parallel fins extending outwardly from the heatsink base. A heat pipe extending through a folded mesh is attached to the heat spreader within the volume container, extends through an access aperture outside the volume container and is attached to the heatsink base providing a heat removal path for the processor circuits. Within the volume container the heat pipe includes a plurality of bends to maintain the anti-tamper capability of the computer processor system.

In accordance with features of the invention, a plurality of the heat pipes is arranged in parallel to effectively remove the required heat load. The heat pipes have a small diameter for minimizing the size of a required access aperture and maintaining robust anti-tamper packaging structure.

In accordance with features of the invention, the predefined processor circuits include memory devices associated with a processor. The memory devices include high speed dynamic random access memory (DRAM), and a nonvolatile random access memory (NVRAM). The predefined processor circuits include a cryptographic logic unit and a field programmable gate arrays (FPGAs) unit. The predefined processor circuits provide secure processing with a high robustness level with the anti-tamper logic.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
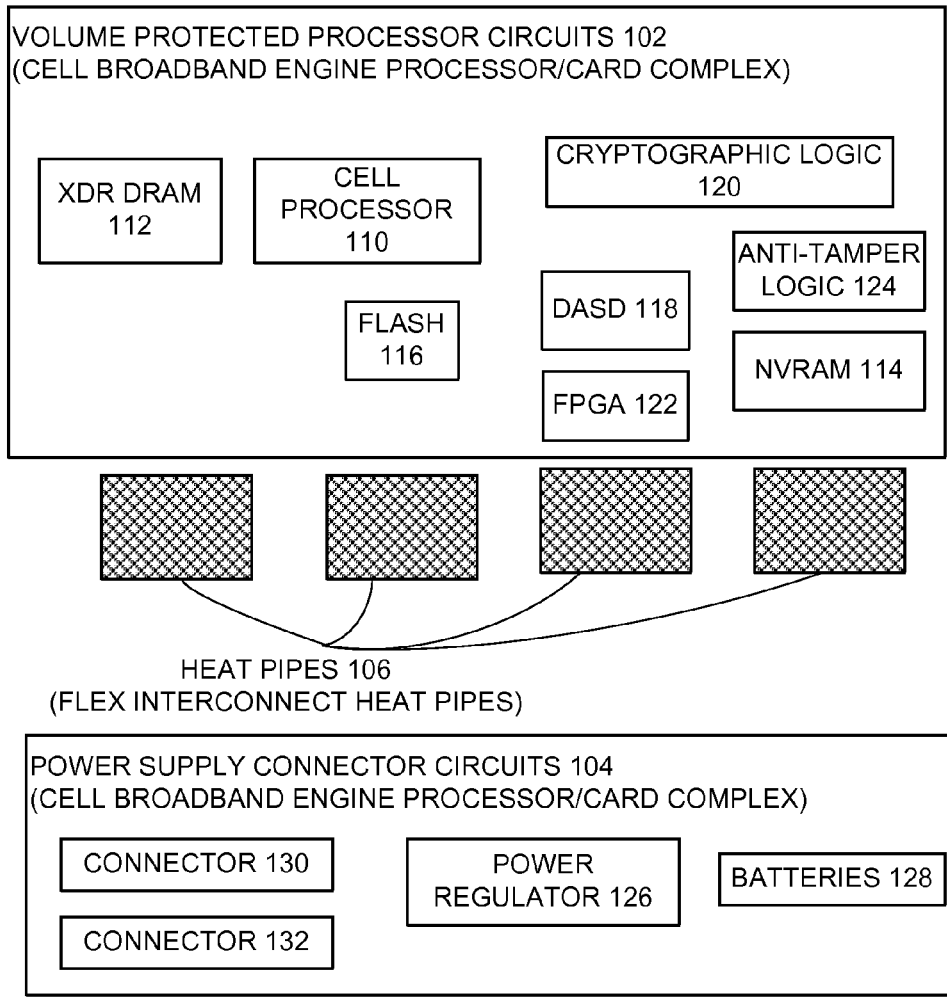
FIG. 1 is a schematic diagram of an exemplary computer processor system for implementing anti-tamper capability and enhanced heat removal in accordance with the preferred embodiment.

Having reference now to the drawings, in FIG. 1, there is shown an exemplary computer processor system generally designated by the reference character 100 in accordance with the preferred embodiment.

In accordance with features of the preferred embodiment, computer processor system 100 has anti-tamper capability and thermal packaging structure for implementing enhanced heat removal from processor circuitry, such as, a high-performance cell processor complex.

Computer processor system 100 includes volume protected processor circuits 102 and power supply connector circuits 104. The volume protected processor circuits 102 are arranged with a plurality of heat pipes 106 for effectively and efficiently providing a heat removal path for volume protected processor circuits 102. The volume protected processor circuits 102 define, for example, a high-performance cell processor and card complex with anti-tamper capability.

Figure 2:
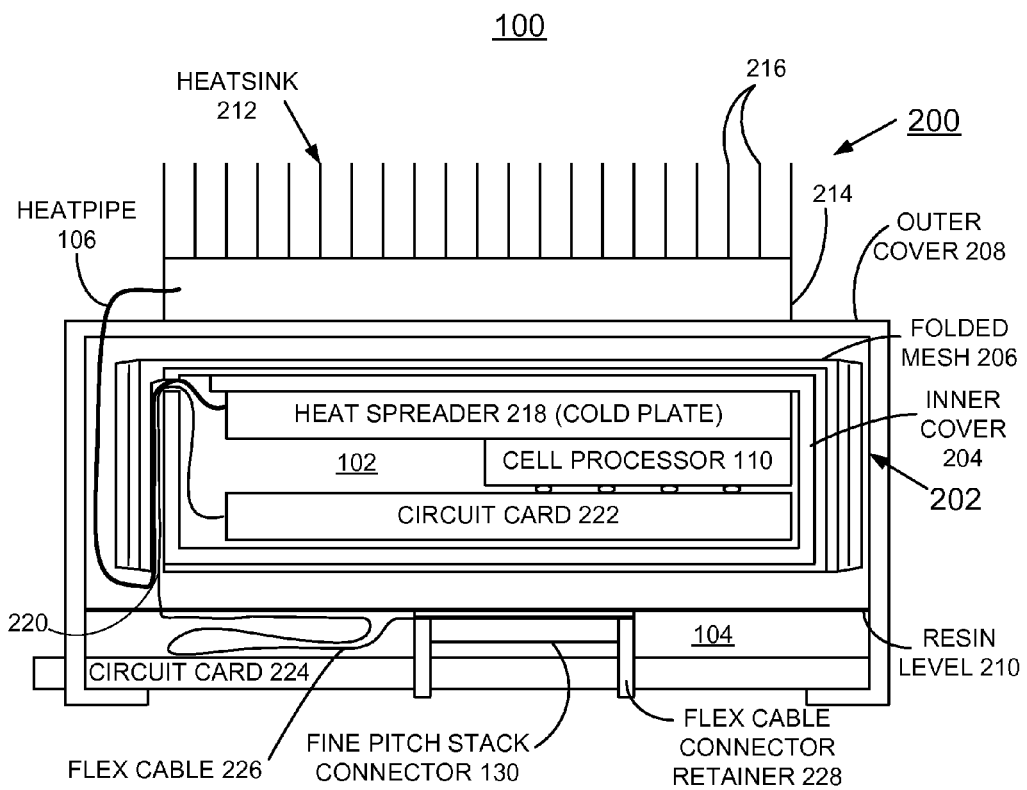
FIG. 2 is a schematic diagram illustrating an exemplary anti-tamper and thermal packaging structure for implementing enhanced heat removal from processor circuitry, such as, a high-performance cell processor complex of the computer processor system of FIG. 1 in accordance with the preferred embodiment.

In accordance with features of the preferred embodiment, an integrated heat pipe assembly is provided to effectively remove the high power from the volume protected processor circuits 102 within an anti-tamper and thermal packaging structure, for example, as illustrated in FIG. 2. The integration occurs by combining the heat pipe escape path with the protective mesh material, in a similar manner used for flexible cables. For proper security, the multiple parallel small heat pipes 106 are arranged to have multiple bends, such as a minimum of two ninety degree bends, in the escape path under a protective mesh layer.

In accordance with features of the preferred embodiment, each of the heat pipes 106 preferably includes an outer flexible metal mesh. Utilizing multiple parallel small heat pipes 106, such as 4 pipes with a minimum 3 mm diameter, effectively removes the required heat load while minimizing the size of a required access aperture in a volume container to maintain a very robust anti-tamper package structure.

As shown the volume protected processor circuits 102 includes a cell processor 110, an extreme data rate (XDR) dynamic random access memory (DRAM) 112, a nonvolatile random access memory (NVRAM) 114, and a flash memory 116, a direct access storage device (DASD) 118, a cryptographic logic unit 120, a field programmable gate arrays (FPGAs) unit 122, and an anti-tamper logic 124.

The volume protected processor circuits 102 are arranged for secure processing and protected from such attacks as physical probing, x-ray, E-beam probing and the like. The cryptographic logic unit 120 functions as a cryptographic hardware accelerator providing the capability to protect data at different government and commercial levels. The added FPGAs unit 122 allows for expanded functions for the cryptographic logic unit 120. Computer processor system 100 provides a powerful computing environment via the cell processor 110, while providing secure processing to a high robustness level via the anti-tamper logic 124, cryptographic logic unit 120 and the FPGAs unit 122.

The power supply connector circuits 104 are provided within a separate zone not requiring volume protection including, for example, a power regulator 126, batteries 128, and a plurality of connectors 130, 132.

Computer system 100 is shown in simplified form sufficient for understanding the present invention. The illustrated computer system 100 is not intended to imply architectural or functional limitations. The present invention can be used with various hardware implementations and systems and various other internal hardware devices.

Figure 3:
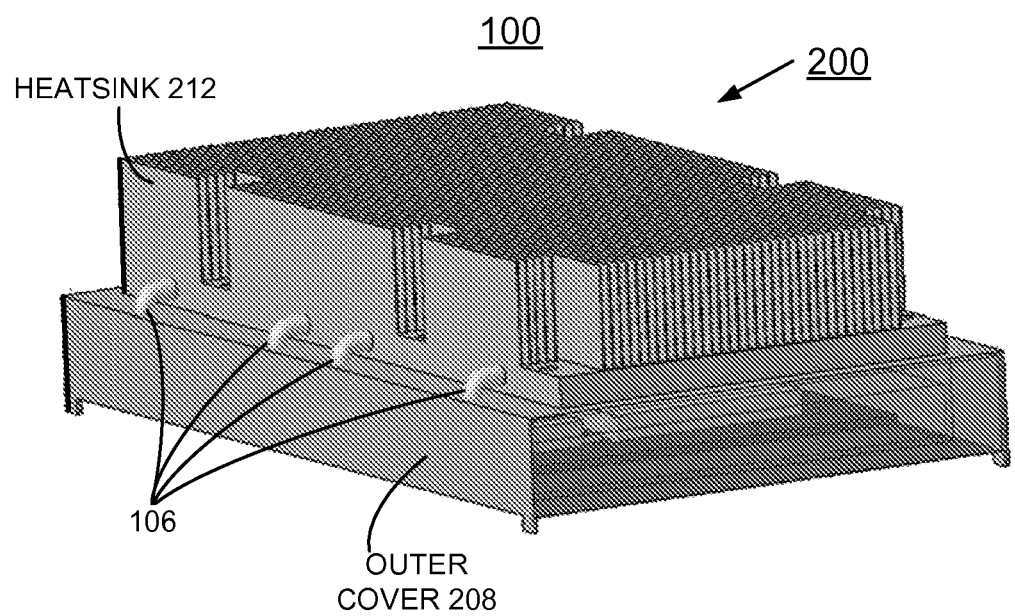
FIG. 3 is a perspective view illustrating the exemplary anti-tamper and thermal packaging structure of FIG. 2 in accordance with the preferred embodiment.

Referring also to FIGS. 2 and 3, an anti-tamper and thermal packaging structure generally designated by the reference character 200 in accordance with the preferred embodiment. The anti-tamper and thermal packaging structure 200 is arranged for implementing enhanced heat removal from processor circuitry including the volume protected processor circuits 102 of the computer processor system 100 and anti-tamper capability.

The anti-tamper and thermal packaging structure 200 includes a volume container generally designated by the reference character 202 substantially containing the predefined processor circuits 102 including the anti-tamper logic 124. The volume container 202 includes an inner cover 204, and a folded flexible mesh member 206 supported by and folded around the inner cover 204, surrounded by an outer cover or external cover 208. A metal sheet material forms both the inner cover 204 and outer cover 208, for example, a copper sheet having a thickness of about 0.5 mm. A resin layer 210 extends below the volume container 202 within the outer cover 208. The resin layer 210 is an encapsulation resin formed, for example, of a polyurethane material having UL94-V0 flammability rating.

In accordance with features of the preferred embodiment, the use of heat pipes 106 provides a low thermal resistance path through the anti-tamper package structure 200, where the heat is then effectively dissipated to the external environment through a heatsink structure 212 attached to the outer cover 208. FIG. 2 illustrates an exemplary heat pipe escape path including a plurality of required bends enabling anti-tamper capability.

The heatsink structure 212 is attached to the external cover 208 above the volume container 202. The heatsink structure 212 includes an elongated heatsink base 214 and a plurality of parallel fins 216 extending outwardly from the heatsink base. The heatsink base 214, the fins 216, and the heat pipes 106 typically are formed of copper.

A heat spreader or cold plate 218 is provided with predefined processor circuits 102 within the volume container 202. Each heat pipe 106 winds through the folded metal mesh 206, and is attached to the heat spreader 218 within the volume container 202, extends through an access aperture 220 to outside the volume container 202 and is attached to the heatsink base 214 providing a heat removal path for the processor circuits 102. The heat pipes 106 are attached to the heat spreader 218 and to the heatsink base 214, for example, by soldering.

Within the volume container 202 and the external cover 208, each of the heat pipes 106 includes a plurality of bends such as illustrated in FIG. 2 to maintain the anti-tamper capability of the computer processor system 100. The volume container 202 contains a circuit card 222 connected to the predefined processor circuits 102 with a chip defining the cell processor 110 positioned in contact engagement with the heat spreader 218.

In the anti-tamper and thermal package structure 200 as shown, an inside surface of the outer cover 208 carries a circuit card 224 connected to the power supply connector circuits 104. A flexible cable 226 connected to the circuit card 222 includes a generally Z-shaped bending portion for providing proper security for anti-tamper capability. The Z-shaped bending portion of flexible cable 226 is spaced from a flexible cable connector retainer 228 receiving connector 130, for example, a fine pitch stack connector.

Figure 4:
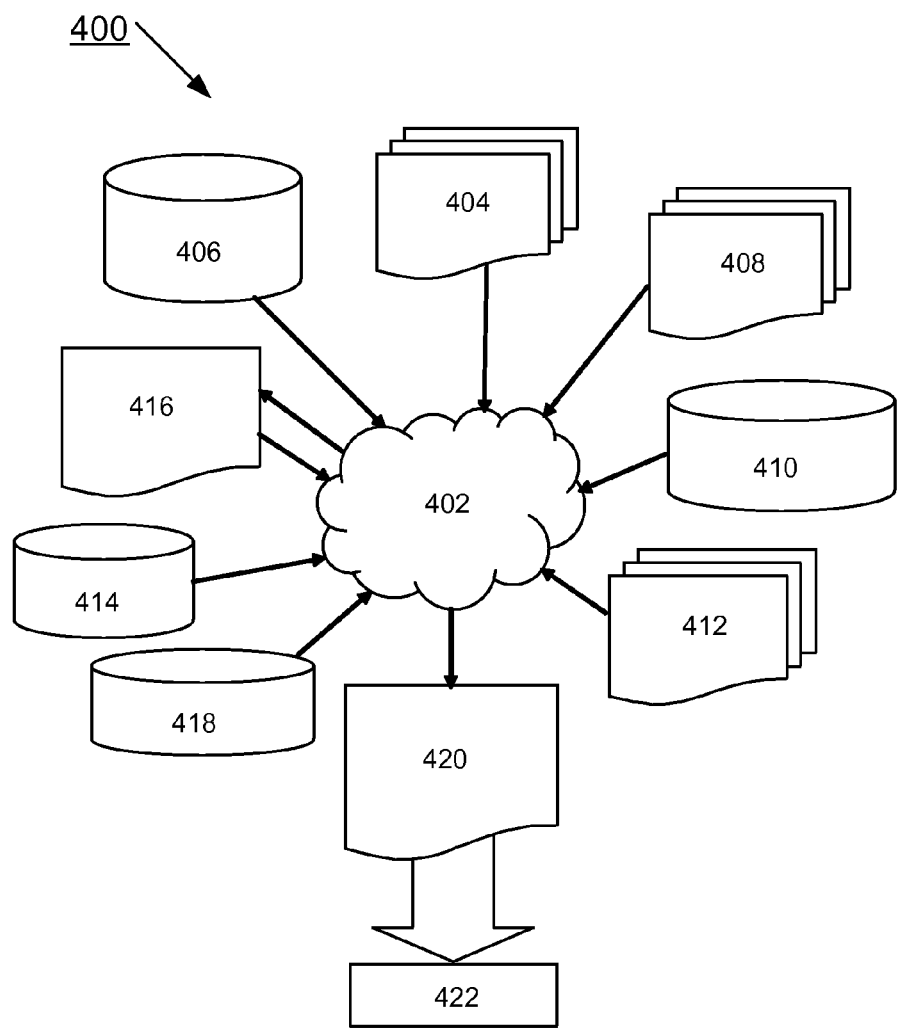
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 100 in the form of schematics or HDL, a hardware-description language, for example, Verilog, VHDL, C, and the like. Design structure 402 may be contained on one or more machine readable medium. For example, design structure 402 may be a text file or a graphical representation of circuit 100. Design process 404 preferably synthesizes, or translates, circuit 100 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 42 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1 and 2, along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1 and 2. Design structure 420 may then proceed to a stage 422 where, for example, design structure 420: proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A computer processor system with anti-tamper capability and thermal packaging structure for implementing enhanced heat removal from processor circuitry comprising:
    a plurality of predefined processor circuits; said predefined processor circuits including anti-tamper logic;
    a volume container substantially containing the predefined processor circuits including the anti-tamper logic;
    a heat spreader associated with the predefined processor circuits within said volume container;
    an external cover extending around said volume container;
    a heatsink structure attached to an outside surface of said external cover; said heatsink structure including a heatsink base and a plurality of parallel fins extending outwardly from said heatsink base;
    a heat pipe; said heat pipe being attached to said heat spreader within said volume container, extending outside said volume container through an access aperture and being attached to said heatsink base providing heat removal from the processor circuits; said heat pipe including a plurality of bends within said volume container to maintain the anti-tamper capability of the computer processor system.

2. The computer processor system of claim 1, wherein said volume container includes an inner cover, said inner cover being formed of a metal material.

3. The computer processor system of claim 2, wherein said inner cover is formed of a copper sheet material.

4. The computer processor system of claim 2, wherein said volume container includes a folded flexible mesh layer disposed on said inner cover.

5. The computer processor system of claim 1, wherein said external cover containing said volume container is formed of a metal material.

6. The computer processor system of claim 1, wherein said external cover containing said volume container is formed of a copper sheet material.

7. The computer processor system of claim 1 includes a plurality of said heat pipes; each of said heat pipes having a small diameter minimizing the size of a required access aperture.

8. The computer processor system of claim 7, wherein said heat pipes are attached to said heat spreader and to said heatsink base by soldering.

9. The computer processor system of claim 1 includes a resin layer extending below said volume container within said outer cover.

10. The computer processor system of claim 9 includes power supply connector circuits located below said volume container within said outer cover.

11. The computer processor system of claim 1, wherein said predefined processor circuits include a processor and memory devices associated with said processor.

12. The computer processor system of claim 1, wherein said predefined processor circuits include high speed dynamic random access memory (DRAM), and a nonvolatile random access memory (NVRAM).

13. The computer processor system of claim 1, wherein said predefined processor circuits include a cryptographic logic unit and a field programmable gate arrays (FPGAs) unit.

14. A method for implementing a computer processor system with an anti-tamper capability and enhanced heat removal from processor circuitry comprising:
    providing a plurality of predefined processor circuits including anti-tamper logic within a volume container; said volume container substantially containing the predefined processor circuits including the anti-tamper logic;
    attaching a heat spreader to a module containing the predefined processor circuits within said volume container;
    attaching a heatsink structure to an external cover; said external cover extending around said volume container and said heatsink structure including a heatsink base and a plurality of parallel fins extending outwardly from said heatsink base;
    attaching a heat pipe to said heat spreader within said volume container, said heat pipe extending outside said volume container through an access aperture, attaching said heat pipe to said heatsink base for providing heat removal from the processor circuits; and providing a plurality of bends in said heat pipe within said volume container to maintain the anti-tamper capability of the computer processor system.

15. The method of claim 14, includes providing a plurality of said heat pipes arranged in parallel; each of said heat pipes having a small diameter minimizing the size of a required access aperture.

16. The method of claim 14, wherein providing said plurality of predefined processor circuits including anti-tamper logic within said volume container includes providing a cryptographic logic unit and a field programmable gate arrays (FPGAs) unit within said volume container.

17. A design structure embodied in a machine readable medium used in a design process, the design structure comprising:
    a plurality of predefined processor circuits; said predefined processor circuits including anti-tamper logic;
    a volume container substantially containing the predefined processor circuits including the anti-tamper logic;

a heat spreader associated with the predefined processor circuits within said volume container;

an external cover containing said volume container;

a heatsink structure attached to said external cover; said heatsink structure includes a heatsink base and a plurality of parallel fins extending outwardly from said heatsink base;

a heat pipe; said heat pipe being attached to said heat spreader within said volume container, extending outside said volume container through an access aperture and being attached to said heatsink base providing a heat removal path for the processor circuits; said heat pipe including a plurality of bends within said volume container to maintain the anti-tamper capability of the computer processor system.

18. The design structure of claim 17, wherein the design structure comprises a netlist, which describes the circuit.

19. The design structure of claim 17, wherein the design structure resides on storage medium as a data format used for the exchange of layout data of integrated circuits.

20. The design structure of claim 17, wherein the design structure includes at least one of test data files, characterization data, verification data, or design specifications.

\* \* \* \* \*